United States Patent [19]

Moll et al.

[11] 4,197,175

[45] Apr. 8, 1980

[54] METHOD AND APPARATUS FOR EVAPORATING MATERIALS IN A VACUUM COATING PLANT

[75] Inventors: Eberhard Moll, Balzers, Liechtenstein; Helmut Daxinger, Wangs, Switzerland

[73] Assignee: Balzers Aktiengesellschaft, Liechtenstein

[21] Appl. No.: 909,807

[22] Filed: May 26, 1978

[30] Foreign Application Priority Data

Jun. 1, 1977 [CH] Switzerland ................ 06688/77

[51] Int. Cl.² ............... C23C 13/12; C23C 15/00
[52] U.S. Cl. .................. 204/192 R; 204/192 N; 204/298; 118/719; 118/723; 118/726; 427/38
[58] Field of Search ................ 118/49.1, 50.1, 719, 118/723, 726; 204/192 R, 192 N, 298; 427/38, 39

[56] References Cited

U.S. PATENT DOCUMENTS

| | | | |
|---|---|---|---|
| 3,839,182 | 10/1974 | Sager | 204/298 |
| 3,895,602 | 7/1975 | Bobenrieth | 204/298 |
| 3,984,581 | 10/1976 | Dobler et al. | 204/192 N |
| 4,112,137 | 9/1978 | Zega | 204/192 N |

*Primary Examiner*—L. Dewayne Rutledge
*Assistant Examiner*—William Leader
*Attorney, Agent, or Firm*—McGlew and Tuttle

[57] ABSTRACT

A method and apparatus for evaporating materials in a vacuum evaporator by bombarding a material to be evaporated with electrons generated by a low voltage arc discharge sustained between a hot cathode and an anode comprising, locating the hot cathode in a chamber which is separated from an evaporation chamber wherein the hot cathode chamber communicates with the evaporation chamber through an aperture, connecting the material to be evaporated as the anode in the evaporation chamber, continuously introducing a gas into the hot cathode chamber while evacuating the evaporation chamber to maintain a pressure differential therebetween, and concentrating the beam of electrons by a magnetic field so as to obtain on the surface of the anode a power density sufficient for evaporation.

23 Claims, 1 Drawing Figure

U.S. Patent
Apr. 8, 1980
4,197,175
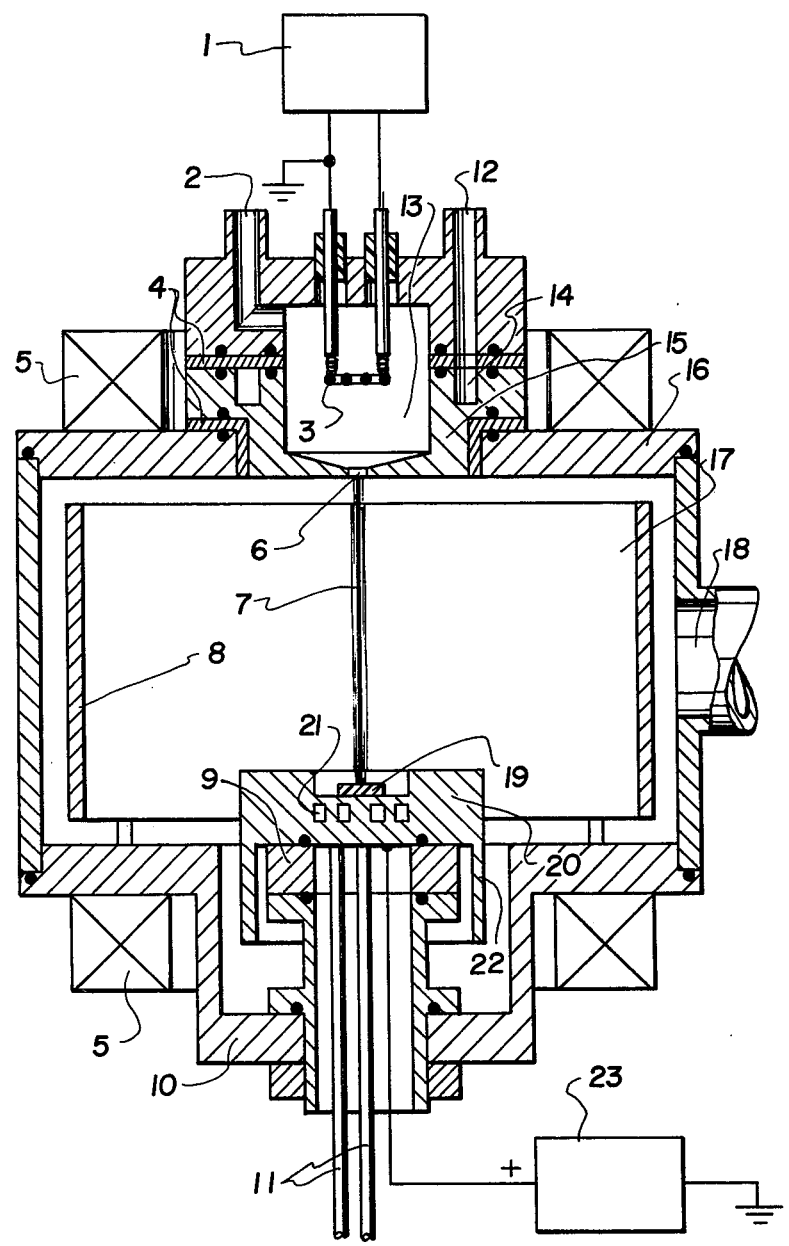

METHOD AND APPARATUS FOR EVAPORATING MATERIALS IN A VACUUM COATING PLANT

FIELD AND BACKGROUND OF THE INVENTION

The invention relates to a method and apparatus of evaporating materials in a vacuum evaporator by bombarding the material to be evaporated with electrons from a low-voltage arc discharge.

For the evaporation by means of an electron beam, thre are known so-called electron beam evaporators with a hog cathode. In such evaporators, the power density required for the evaporation is obtained on the material to be evaporated by accelerating a relatively low electronic current (for example, of 1 A) with a relatively high voltage (for example, 10 kV). This produces a beam having a small cross section which, frequently, is directed onto the evaporative material through a magnetic field, along an arcuate path. Such an electron beam entails only a small activation (i.e. ionization, excitation, dissociation) of the residual gas and the vapor in the evaporator. This is due to several reasons: (1) the low current intensity; (2) with high energy levels, the effective cross sections are small; (3) higher residual gas pressures cannot be permitted, since they cause flash-overs in the acceleration path and sputtering of the hot cathode. However, to obtain layers of higher quality, an activation of the vapor of the evaporative material or of the residual gas in the evaporation space would be very desirable in many vapor deposition processes.

Further known are electron beam evaporators with a hollow cathode. Distinction is made between cold and hot hollow cathodes (see, for example, C. T. Wan, D. L. Chambers and D. C. Carmichael, The Journal of Vacuum Science and Technology, Vol 8, No. 8, p. VM 99, 1971). Unlike normal electron beam evaporators, these two kinds can be operated at pressures above $10^{-4}$ mb; the desired current-voltage characteristic, however, is furnished only by the hot hollow cathode. It delivers high currents at a low operating voltage (for example, 100 V, 100 A) and thus ensures an effective activation of the residual gas and the vapor. Hot hollow cathodes, however, are hard to ignite and, therefore, require an additional ignition device. Moreover, at the same time, the cathode material is sputtered and deposited on the substrates to be coated, as contamination.

SUMMARY OF THE INVENTION

The problem underlying the invention is to avoid the disadvantages of the prior art methods and to provide a simple electron beam evaporation method which can be carried out at relatively high pressures and ensures, at the same time, that the residual gas is highly activated and the sputtering of the cathode material is reduced or the still sputtered cathode material is prevented from reaching the substrates.

The inventive method of evaporating material in a vacuum evaporator by bombarding it with electrons from a low-voltage are discharge sustained between a hot cathode placed in a chamber which is separated from the evaporation space and communicates therewith through an aperture, and an anode, while, during the operation, continuously introducing a gas into the hot cathode chamber and keeping the evaporation space, by pumping, under a vacuum sufficient for the provided coating process, is characterized in that (a) the material to be evaporated and placed in the evaporation space is itself connected as anode;

(b) in the evaporation space, the discharge constricted by the mentioned aperture is directed to the anode, in addition, through a magnetic field and concentrated to a beam, in order to obtain on the surface of the anode a power density satisfactory for the vaporization.

During the low-voltage arc discharge, a positive space charge layer is formed in front of the cathode, which, as a virtual anode, accelerates the electrons. To prevent the electrons from losing their energy by collisions with the gas atoms, a lower pressure than that in the hot cathode chamber is maintained along the following discharge path in the evaporation chamber. This differential pressure is obtained by continuously introducing gas into the hot cathode chamber and pumping gas out of the evaporation space. Then, in spite of the long distance they have to cover in the evaporation space, the electrons give off the greatest part of their energy to the evaporative material connected as anode.

Due to the inventive provisions, it is made possible to reduce the cross-sectional area of the focal spot of the electron beam on the material to be evaporated to such an extent that the required power density is easily obtained. By providing an adequate magnetic field extending parallel to the beamed discharge, the electron beam in the evaporation chamber, despite its high current intensity, maintains a cross section of the order of magnitude of the mentioned opening between the hot cathode chamber and the evaporation space. To obtain a satisfactory high rate of evaporation even for metals which are difficult to vaporize, a power density on the anode surface of more than 10 kW per $cm^2$ is advisable.

It is further useful to introduce the gas into the hot cathode chamber continuously in an amount such as to obtain the mean free path of the gas molecules in this chamber in the order of magnitude of the cathode fall distance of the low-voltage arc dishcarge. For the discharge, arc voltages lower than 200 volt are advisable, but only with currents of at least 30 A. It is further advisable to electrically insulate the partition wall comprising the aperture between the hot cathode chamber and the evaporation space and, while carrying out the inventive method, to allow it to assume a floating potential. The material to be evaporated may be kept either at a positive potential or at the ground potential, in which case the ground potential or a negative potential is applied to the cathode. Also advantageous is an operation in which both the cathode and the material to be evaporated are kept at a positive potential relative to the ground. To the substrates to be coated, a negative potential relative to the anode may be applied, and, in addition, they may temporarily (in particular, intermittently) be connected as the cathode of an independent gas discharge. The voltage between the anode and the substrates may be varied while the process is carried out. For example, it is possible to start with a high voltage, to obtain a satisfactory adhesive strength of the layer, which is due to the high sputtering rate connected thereto, and to continue the process at a low voltage, to ensure a uniform growth of the layer.

In one and the same evaporation chamber, a plurality of anodes of different evaporative materials may be provided, to which the electron beam is alternately directed, for example, by means of suitable magnetic fields. Also, a plurality of anodes in the form of evaporation sources may be provided in the same evaporation space and associated with respective hot cathodes accomodated in separate chambers, so that the vapor deposition from these evaporation sources may take place simultaneously or sequentially and under uniform or different electrical conditions (power, power density). A simultaneous vapor deposition from two evaporation sources may be instrumental for producing alloys.

The mentioned various possibilities of connection result in different directions of motion of the ions and, thereby, to variations in the vapor distribution within the evaporation space.

BRIEF DESCRIPTION OF THE DRAWING

The only FIGURE in the application is a cross-sectional view of an apparatus constructed in accordance with the invention.

DESCRIPTION OF THE PREFERRED EMBODIMENT

In the following, the inventive method and a device suitable for carrying out the method are described in more detail with reference to the accompanying drawing. The drawing shows a vacuum evaporation chamber 17 with an evacuation connection 18, which communicates, through an aperture 6, with a hot-cathode chamber 13. A hot cathode 3 is accomodated in this chamber and supplied from a current supply source 1. On the bottom of evaporation chamber 17, a crucible 20 for the material 19 to be evaporated is provided which can be cooled by means of coolant channels 21 and coolant outlet and inlet lines 11. A support 8 in the form of a cylindrical sleeve for receiving the substrates to be coated is provided in the evaporation chamber. The hot-cathode chamber further comprises a gas inlet connection 2 and a coolant channel 14 which serves particularly for cooling the partition wall between the hot-cathode chamber and the evaporation chamber during operation. Magnetic field coils 5 are provided on the outsides of bottom part 10 and cover part 16 of the evaporation chamber, to generate in the evaporation space a magnetic field approximately parallel to the discharge axis 7.

To carry out the inventive method, the substrates to be coated are secured to the side of support 8 facing the evaporation source at 20, the evaporative material 19 is placed in the crucible 20, the evaporation chamber 17 is closed and evacuated, and a suitable gas is introduced into the hot-cathode chamber through line 2. Suitable gases are, primarily, rare gases, if a reaction with the substrates is to be prevented, or the corresponding reactive gases, if such a reaction is desired, for example, to produce layers of metallic compounds. Nitrogen or a gaseous nitrogen compound may be introduced for example to produce nitride layers, a gas containing a gaseous carbon compound may be used to produce carbide layers, a gaseous boron compound to produce boride layers, or oxygen or an oxygen compound containing gas to produce oxide layers. In a process of reactive vapor deposition and to spare the hot cathode 4, however, it is also possible to introduce into the hot-cathode chamber 13 an inert gas and, in order to obtain the required reaction in the evaporation space, to separately introduce into this space the desired gas through another line, so that during the vapor deposition, a reactive residual-gas atmosphere is predominant whose pressures may be adjusted by continuous pumping to a value which is optimal for the process.

EXAMPLE 1

To produce titanium nitride layers, metallic titanium in lumps was placed in crucible 20, the apparatus was evacuated to $10^{-4}$ mb, and nitrogen was introduced into evaporation chamber 17 through line 2, hot-cathode chamber 13, and aperture 6, and continuously pumped out therefrom through evacuation connection 18 and in such an amount as to maintain an $N_2$ presssure of $5 \times 10^{-2}$ mb in the hot-cathode chamber and a residual $N_2$ gas pressure of $5.2 \times 10^{-3}$ millibar in the evaporation chamber. Then, the grounded hot cathode was heated with 1.5 kW and, thereupon, a voltage of +70 volt was applied to the anode. Next, by briefly applying the anode voltage to the partition wall 15 between hot-cathode chamber 13 and evaporation chamber 17, the low-voltage arc was ignited (the voltage indications above, and all in the following relate to the differential voltage relative to the container to which the ground potential was applied). Thereby, a current of 116 A was produced flowing through the hot cathode. The current flowing through the anode was 131 A. The difference of 15 A between the two currents indicates the current circulating through the substrates and the container. By the electron current flowing through crucible 19 as anode, the titanium received therein was melted and evaporated at a rate of about 0.3 g per minute. Due to the effect of the residual gas which was strongly ionized by the low-voltage arc discharge between the hot cathode and the anode, a hard titanium nitride layer of extreme adhesive strength and gold-yellow color has been obtained on the substrates secured to support 8. Such layers are useful, for example, as coatings for articles which are exposed to strong wear.

In the following, further examples are given indicating the used voltage, currents, and residual gas atmosphere during the evaporation of titanium. In the examples, a power of about 5 to 8 kW is delivered on an anode surface of about 0.2 cm$^2$ (half width of the beam about 0.5 cm).

EXAMPLES (2) Gas: argon, $5 \times 10^{-3}$ mb
Cathode: 0 V; 133 amp
Anode: +37 V; 150 amp
Container+substrates: 0 V; 17 amp; 629 w
(3) Gas: argon, $2.5 \times 10^{-3}$ mb
Cathode: −40 V; 152 amp
Anode: 0 V; 117 amp
Container+substrates: 0 V; 35 amp; 0 w
(4) Gas: argon, $2.5 \times 10^{-3}$ mb
Cathode: +30 V; 116 amp
Anode: +80 V; 144 amp
Container+substrates: 0 V; 28 amp; 2240 w
(5) Gas: argon, $5 \times 10^{-3}$ mb
Cathode: −40 V; 152 amp
Anode: 0 V; 117 amp
Container: 0 V; 30 amp; 0 w
Substrates: −200 V; 5 amp; 1000 w
(6) Gas: $N_2$, $5 \times 10^{-3}$ mb
Cathode: 0 V; 116 amp
Anode: +70 V; 131 amp
Container+substrates: 0 V; 15 amp; 1050 w While depositing pure metal layers, as already mentioned, the operation is carried out with an inert residual gas atmosphere. Hard, resistant metal compounds of nitrides, carbides, borides, or oxides, on the contrary, may be obtained by a reactive vapor deposition. For this purpose, in particular, the transition elements of the fourth to eighth group of the periodic system, thus titanium to nickel, zirconium to palladium, and hafnium to platinum, are to be considered.

We claim:

1. A method of evaporating materials in a vacuum evaporator by bombarding a material to be evaporated with electrons generated by a low-voltage arc discharge sustained between a hot cathode and an anode comprising the steps of locating the hot cathode in a chamber which is separated from an evaporation chamber wherein the hot cathode chamber communicates with the evaporation chamber through an aperture, connecting the material to be evaporated as the anode in the evaporation chamber, continuously introduce a gas into the hot cathode chamber while evacuating said evaporation chamber to maintain a predetermined pressure differential therebetween, constricting the flow of electrons from said cathode through said aperture to said anode, and concentrating the beam of electrons by a magnetic field so as to obtain on the surface of the anode a power density sufficient for evaporation.

2. A method of evaporating material in a vacuum evaporator as defined in claim 1 and including the step of disposing the magnetic field so as to extend parallel to the beam of electrons whereby said magnetic field maintains the cross section of the electron beam at substantially the diameter of the aperture.

3. A method as defined in claim 1 and including the step of maintaining the voltage of said low voltage arc discharge at less than 200 volts and a current of at least 30 amps.

4. A method of evaporating material in a vacuum evaporator as defined in claim 1 and including the step of operating the low voltage arc discharge with a power density of more than 10 KW per cm$^2$ on the surface of the anode.

5. A method of evaporating material in a vacuum evaporator as defined in claim 1 and including the step of electrically insulating the hot cathode chamber from the evaporation chamber, and maintaining the evacuation chamber at a floating potential.

6. A method of evaporating material in a vacuum evaporator as defined in claim 5 and including the step of igniting the discharge by temporarily applying the anode voltage to a wall portion of the electrically insulated hot cathode chamber.

7. A method of evaporating material in a vacuum evaporator as defined in claim 1 and including the step of varying the rate of evaporation by varying the intensity of the magnetic field.

8. A method of evaporating material in a vacuum evaporator as defined in claim 1 and including the step of maintaining the cathode at a ground potential and material to be evaporated at a potential which is positive relative to the ground.

9. A method of evaporating material in a vacuum evaporator as defined in claim 1 and including the step of maintaining the material to be evaporated at ground potential and the cathode at a potential which is negative relative to the ground.

10. A method of evaporating material in a vacuum evaporator as defined in claim 1 and including the step of maintaining both the cathode and the material to be evaporated at a potential which is positive relative to the ground.

11. A method of evaporating material in a vacuum evaporator as defined in claim 1 and including the step of utilizing a plurality of anodes to effect vapor deposition from a plurality of evaporation sources under different electrical conditions.

12. A method of evaporating material in a vacuum evaporator as defined in claim 1 and including the step of maintaining the substrate to be coated at a potential which is negative relative to the anode.

13. A method of evaporating material in a vacuum evaporator as defined in claim 12 and including the step of varying the voltage between the anode and the substrate.

14. A method of evaporating material in a vacuum evaporator as defined in claim 12 and including the step of intermittently connecting the substrates as the cathode of an independent gas discharge.

15. A method of evaporating material in a vacuum evaporator as defined in claim 1 and including the step wherein the gas introduced into said hot cathode chamber is an inert gas.

16. A method of evaporating material in a vacuum evaporator as defined in claim 1 and including the step of maintaining an atmosphere in the evaporation chamber which contains a reactive gas.

17. A method of evaporating material in a vacuum evaporator as defined in claim 1 and including the step of maintaining an atmosphere in the evaporation chamber which contains a reactive gas selected from the group consisting of nitrogen or a gaseous nitrogen compound, gaseous carbon compound, gaseous boron compound, oxygen and oxygen compound.

18. A method of evaporating material in a vacuum evaporator as defined in claim 1 and including the step of maintaining an atmosphere which contains a mixture of reactive gases in the evaporation chamber.

19. A vacuum evaporator comprising means defining an evaporation chamber which is adapted to be connected to a source of negative pressure, means defining a hot electrode chamber, said electrode chamber having an aperture interconnecting said electrode chamber to said evaporation chamber, a hot cathode disposed in said electrode chamber, means electrically insulating said electrode chamber from said evaporation chamber, an anode disposed in said evaporation chamber, said anode being adapted to support the material to be evaporated, means defining a gas inlet to said electrode chamber, and a gas outlet for said evaporation chamber, a power source connected to said cathode for activating said cathode, and a power source connected to said anode whereby a low voltage arc discharge is sustainable between said hot cathode and said anode to evaporate the material to be evaporated, and means disposed on opposite sides of the vacuum evaporation to generate a magnetic field in the evaporation chamber, said aperture being of a size to maintain a predetermined pressure differential between said evacuation chamber and hot electrode chamber when gas is supplied to said gas inlet and removed from said gas outlet.

20. A vacuum evaporator as defined in claim 19 and including a support means for supporting a substrate to be coated in said evacuation chamber.

21. A vacuum evaporator as defined in claim 19 and including a plurality of anodes disposed in said evacuation chamber.

22. A vacuum evaporator as defined in claim 21 and including a plurality of cathode chambers each having a cathode disposed therein.

23. A vacuum evaporator as defined in claim 19 wherein said cathode and anode are oppositely disposed to create an electron beam therebetween, and said magnetic means include oppositely disposed magnetic field coils to generate a magnetic field in said evaporation chamber approximately parallel to the electron beam.

* * * * *